United States Patent [19]

Nagumo

[11] Patent Number: 5,352,130
[45] Date of Patent: Oct. 4, 1994

[54] CONTACT FOR IC SOCKET

[75] Inventor: Takayuki Nagumo, Sagamihara, Japan

[73] Assignee: Minnesota Mining & Manufacturing Company, St. Paul, Minn.

[21] Appl. No.: 73,588

[22] Filed: Jun. 8, 1993

[30] Foreign Application Priority Data

Jun. 10, 1992 [JP] Japan .................. 4-150340

[51] Int. Cl.⁵ ............................. H01R 11/22
[52] U.S. Cl. ..................... 439/266; 439/331
[58] Field of Search ................ 439/72, 68, 73, 266, 439/267, 268, 525, 526, 330, 331

[56] References Cited

U.S. PATENT DOCUMENTS

| | | | |
|---|---|---|---|
| 4,623,208 | 11/1986 | Kerul et al. | |
| 4,678,255 | 7/1987 | Carter | 439/266 X |
| 4,846,703 | 7/1989 | Matsuoka et al. | 439/71 |
| 4,846,704 | 7/1989 | Ikeya | 439/72 |
| 4,886,470 | 12/1989 | Billman et al. | 439/266 |
| 4,993,955 | 2/1991 | Savant | 439/73 |
| 5,076,798 | 12/1991 | Uratsuji | 439/73 |
| 5,114,358 | 5/1992 | Myers | 439/266 |
| 5,205,756 | 4/1993 | Myers | 439/266 |

FOREIGN PATENT DOCUMENTS 62-160676 12/1985 Japan .
63-62175 9/1986 Japan .
63-299257 5/1987 Japan .
2-94374 9/1988 Japan .

*Primary Examiner*—Khiem Nguyen
*Attorney, Agent, or Firm*—Gary L. Griswold; Walter N. Kirn; John C. Barnes

[57] ABSTRACT

An IC socket including contacts capable of facilitating remounting of an IC package and ensuring a reliability of engagement with the IC package. A contact of an IC socket, which comprises a socket body having a plurality of contacts arranged to be engaged with IC package leads while being resiliently depressed and a cover provided to be vertically movable for the socket body and to displace the contacts outwardly against their resilience to release the contacts from engagement when the cover is moved down, is provided with a fixing portion which is fixed to the socket body, a C-shaped cantilever portion which is formed integral with an upper part of the fixing portion and has an opening facing the inside of the socket body, a resilient curved portion which is formed integral with an upper part of the C-shaped cantilever portion in a circular curved shape, as if the C-shaped part is substantially reversed, to have an almost S-shaped profile in coupling with the cantilever portion, a contact portion which is formed with the resilient curved portion to come in contact with the lead, and an engaging portion engaged with said cover, which is formed integral with the resilient curved portion and provided in an opposite direction to the contact portion in reference to the resilient curved portion.

2 Claims, 20 Drawing Sheets

CONTACT FOR IC SOCKET

BACKGROUND OF THE INVENTION

1. Field of the Invention

The present invention relates to an IC socket which comprises a socket body, a cover and a plurality of contacts and allows engagement and disengagement of said contacts with the leads of the IC package by vertical movement of said cover, and, more specifically, an improvement in the operation and engagement of the contacts with the IC package.

2. Description of the Prior Art

Generally, all IC packages are subject to screening inspections by several methods to ensure their original functions. One of these screening inspections of the IC packages is a burn-in test, which is intended to test high temperature characteristics of IC packages by setting the IC packages mounted on IC sockets in a convective oven and actuating them in a high temperature environment.

For use in the above described burn-in tests, several IC sockets adapted to inspections by automatic machines have bene applied. For example, the IC sockets applicable to automatic machines have been disclosed in the Unexamined Patent Publication 1987-160676, Unexamined Patent Publication 1988-62175, Unexamined Patent Publication 1988-299257, Unexamined Patent Publication 1990-94347, U.S. Pat. No. 4,623,208 and U.S. Pat. No. 4,886,470.

FIGS. 15 to 20 respectively show the IC sockets disclosed in the above documents. More specifically, FIG. 15 is a cross-sectional view of the conventional IC socket disclosed in the Unexamined Patent Publication 1987-160676, FIG. 16 is a cross-sectional view of the conventional IC socket disclosed in the Unexamined Patent Publication 1988-62175, FIG. 17 is a cross-sectional view of the conventional IC socket disclosed in the Unexamined Patent Publication 1988-299257, FIG. 18 is a cross-sectional view of the conventional IC socket disclosed in the Unexamined Patent Publication 1990-94374, FIG. 19 is a cross-sectional view of the conventional IC socket disclosed in the U.S. Pat. No. 4,623,208 and FIG. 20 is a cross-sectional view of the conventional IC socket disclose din the U.S. Pat. No. 4,886,470.

These IC sockets respectively comprise a socket body 1', cover 2' and a plurality of contacts 3'. The contacts 3' respectively have a contact portion 34' for leads of the IC package, a circular-curved cantilever portion 32' and an engaging portion 35' for the cover. When the cover 2' is pushed down against a repulsive force of the contacts, these contacts 3' are displaced outwardly and released from engagement with the leads of the IC package. Under this condition, therefore, the IC package can be remounted. When the cover 2' is released from pushing force, the contacts 3' are rotated in the opposite direction and re-engaged with the leads of the IC package.

However, these IC sockets of the prior art have the problems as described below since the opening of the circular-curved cantilever portion 32' of the contact is faced outwardly and the contact is displaced mainly by a resilient profiled portion.

Specifically, the connecting portion 36', where the contact portion 34' and the engaging portion 35' are branched from the cantilever portion 32', is moved down when operated and therefore the amount of movement of the contact portion in a direction where the contact portion 34' moves away from the IC package is small, the IC package can be mounted or demounted, and the leads of the IC package curve during remounting operation.

An internal stress of the contacts 3' is concentrated partially in operation and the spring characteristic of the contacts cannot be maintained for a long period of time.

A force of engagement of the contacts and the leads is obtained as a resilient repulsive force, by which the contacts are displaced as much as the thickness of the leads of the IC package, and therefore, the engaging force has been substantially affected in accordance with the variations in the thickness of leads when IC packages having different thicknesses of IC package leads and a stable engaging force could not be obtained.

In addition, the engaging portion 21' of the cover 2' for the contacts 3' has been formed as a horizontal surface or a single inclined surface and therefore there has been no variation of the depressing force of the cover 2' during depressing operation and the lowest position of downward movement could not actually be known. Accordingly, the cover has been further pushed down even when it is at the lowest position and the IC socket and the board have been damaged in some cases.

In view of the above-described actualities, an object of the present invention is to provide an IC socket, including the contacts, capable of facilitating the remounting of the IC package and guaranteeing the reliability of engagement with the IC package for a long period of time.

Another object of the present invention is to provide an IC socket including the contacts, which are hardly affected by variations in the thickness of leads of the IC package and are able to provide a stable engaging force.

Another object of the present invention is to provide an IC socket adapted to change a depressing force at a specified position before the lowest position of downward movement, and to know in advance the lowest position when the cover is operated.

SUMMARY OF THE INVENTION

To attain the above objects, an IC socket, comprising a socket body which has a plurality of contacts engaged with the leads of an IC package while being resiliently depressed, and a cover which is vertically movable in relationship to the socket body and slides to depress the contacts to displace them outwardly against their resilience to release the contacts from engagement with the leads of the IC package when the cover is pushed down, has contacts which are constructed to have:

(a) a fixing portion which is fixed to the socket body, (b) a C-shaped cantilever portion which is formed integral with an upper part of the fixing portion and has an opening part facing the inside of the socket body, (c) an S-shaped resilient curved portion which is formed integral with the upper part of the C-shaped cantilever portion in a circular-curved shape as if the C-shaped part of the cantilever portion is substantially reversed and has a profile continuing to the cantilever portion in the s-shape, (d) a contact portion which is formed integral with the resilient curved portion and comes in contact with IC package lead, and e) an engaging portion engaged with the cover, which is formed integral with the resilient curved portion and is provided in an opposite direction to the contact portion in reference to the resilient curved portion.

According to the present invention, in the IC socket, including the contacts which have the above characteristics, the engaging portion of the cover, which slides to engage with the depressed part of the contact side, is formed by two inclined surfaces with different degrees of inclination.

In the IC socket including the contacts constructed as above, the coupling portion, which is branched from the resilient curved portion to the contact portion and the engaging portion, moves up when it is operated and therefore an amount of movement of the contact portion of the contact in a direction where the contact portion moves away from the IC package in operation is large and, in addition, the internal stress of the contacts is distributed to the C-shaped cantilever portion and the resilient curved portion during operation.

A depressing force can be applied before the IC package is mounted when the distance from the contact portion to the fixing portion is set to be smaller than the distance from the fixing portion of the socket body to the IC package mounting portion.

In the IC socket of which the engaging portion of the cover is formed with two inclined surfaces having different degrees of inclination, the pushing down force of the cover varies at a position where the point of contact between the contacts and the cover comes at the coupling part of two inclined surfaces when the cover is moved down and the lowest position of downward movement can be known in advance.

DETAILED DESCRIPTION OF THE PREFERRED EMBODIMENTS OF THE PRESENT INVENTION

Figure 1:
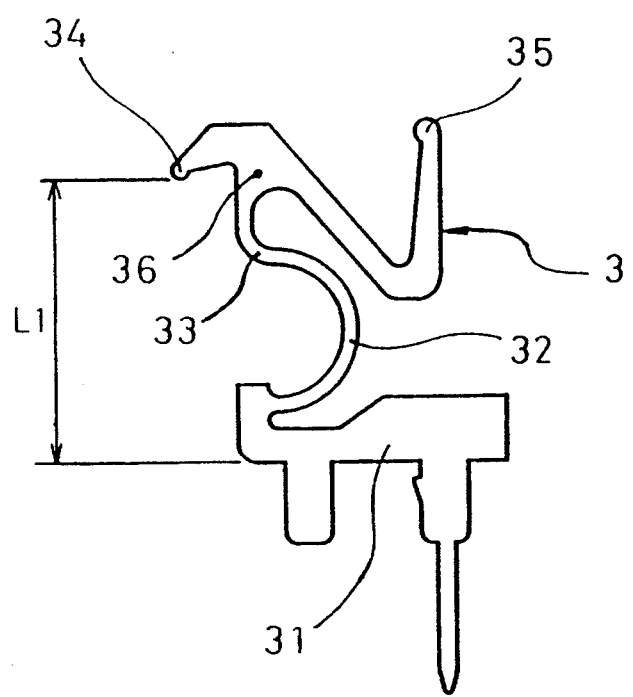
FIG. 1 is an elevational view showing the contact to be used in an IC socket, according to an embodiment of the present invention.
Figure 2:
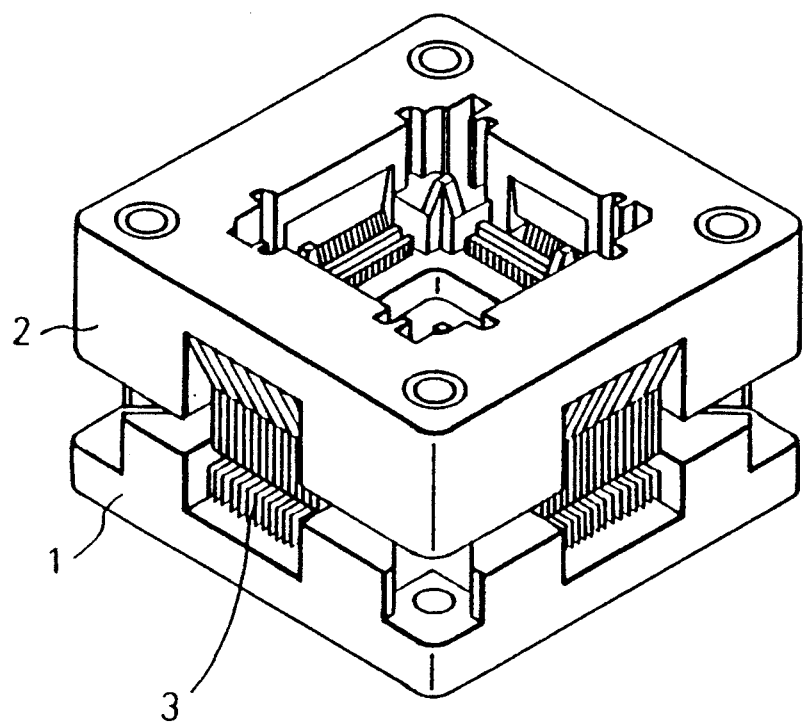
FIG. 2 is a perspective view showing the regular condition of the IC socket, including the contact shown in FIG. 1, before the test according to an embodiment of the present invention.
Figure 3:
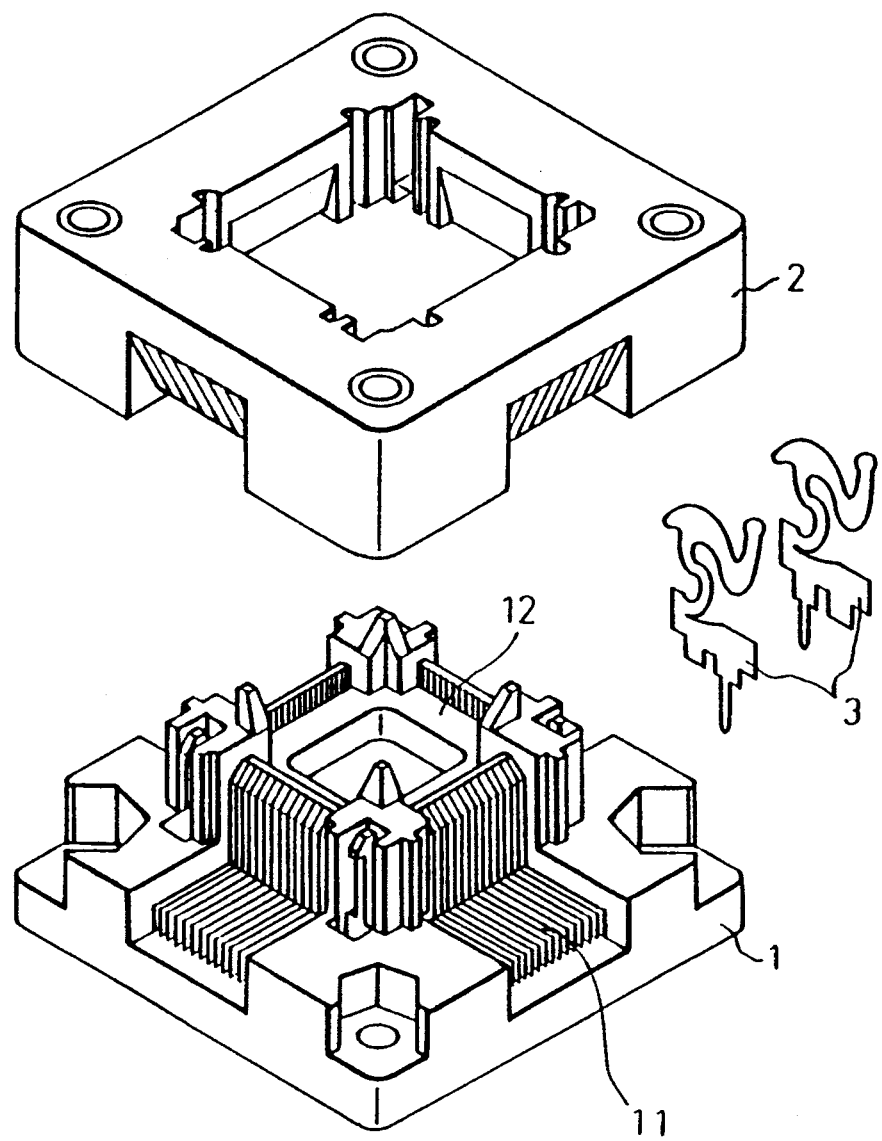
FIG. 3 is a disassembled perspective view showing the overall construction of the IC socket, including the contact shown in FIG. 1, according to an embodiment of the present invention.
Figure 4:
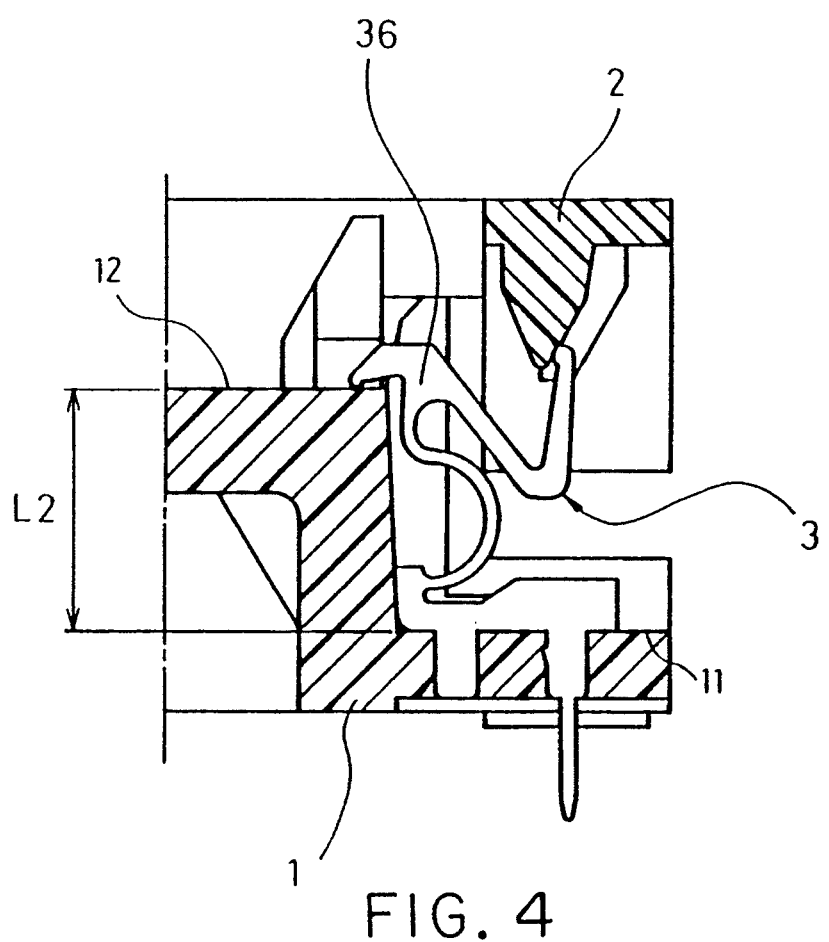
FIG. 4 is a cross-sectional view showing the regular condition of the IC socket, including the contact shown in FIG. 1, before the test, according to an embodiment of the present invention.
Figure 5:
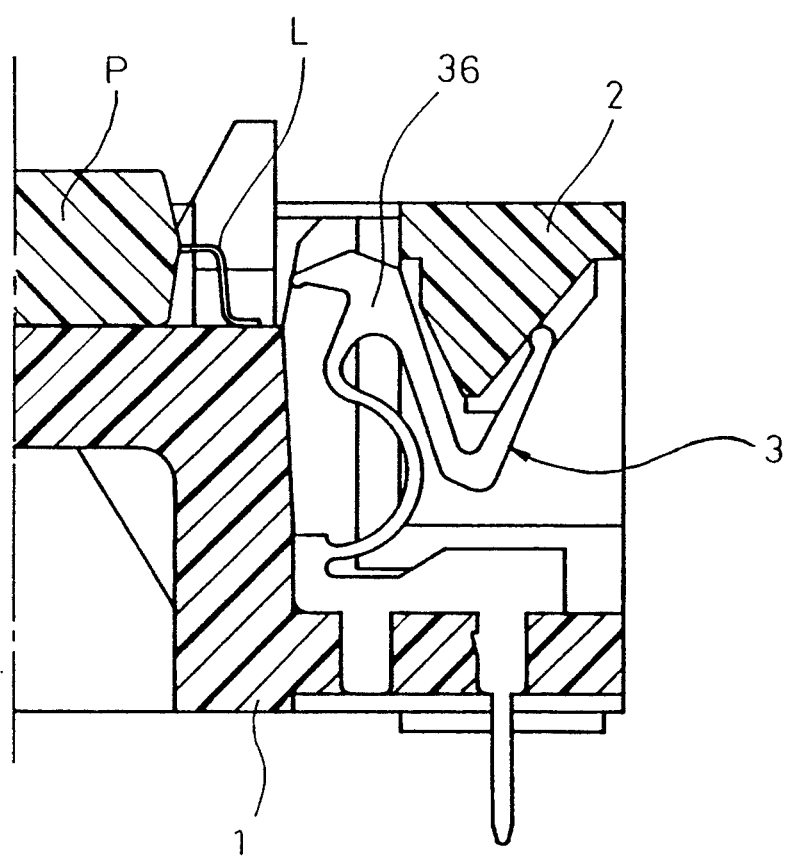
FIG. 5 is a cross-sectional view showing an operating condition of the IC socket, including the contact shown in FIG. 1, according to an embodiment of the present invention.
Figure 6:
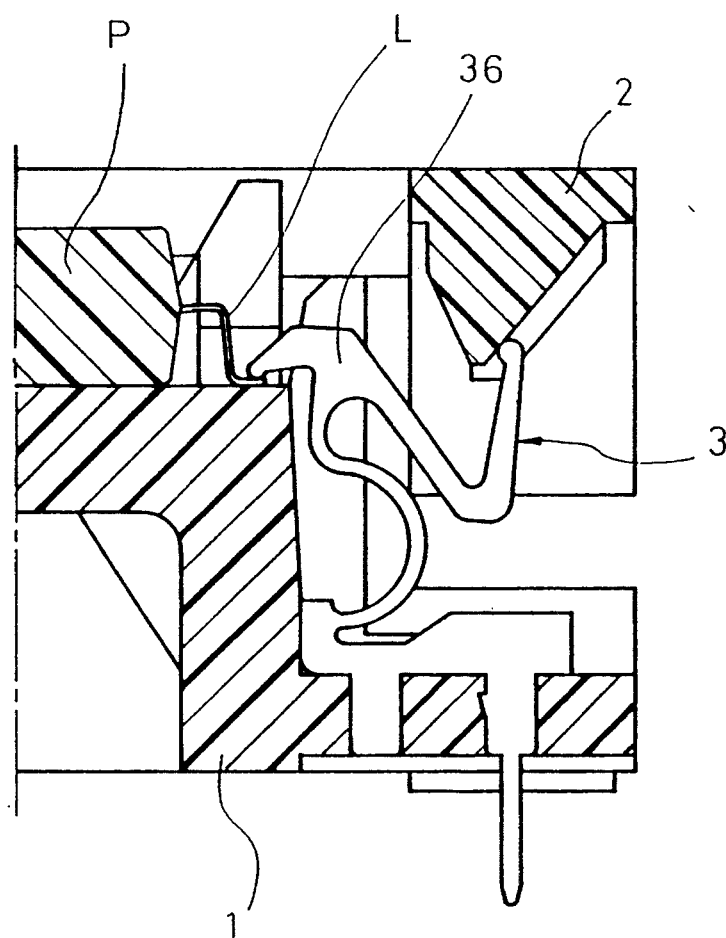
FIG. 6 is a cross-sectional view showing the IC package mounting condition of IC socket, including the contact shown in FIG. 1, according to an embodiment of the present invention.

The following describes the embodiments of the present invention, referring to the accompanying drawings. FIG. 1 is an elevation showing the contact to be used in the IC socket according to the embodiment of the present invention. FIG. 2 is a perspective view showing the regular condition before the test of the IC socket, including the contact, shown in FIG. 1, and FIG. 3 is a disassembled perspective view showing the overall construction of the IC socket, including the contact, shown if FIG. 2. In addition, FIG. 4 is a cross-sectional view showing the regular condition before the test of the IC socket, including the contact shown in FIG. 1, FIG. 5 is a cross-sectional view showing the operating condition of the IC socket, including the contact, shown in FIG. 1, and FIG. 6 is a cross-sectional view showing the IC package mounting condition of the IC socket, including the contact, shown in FIG. 1. The IC socket comprises a socket body 1, a cover 2 and a plurality of contacts 3, as shown in FIGS. 2 and 3, and the contacts 3 are characterized to have the following as shown in FIG. 1:

(a) a fixing portion 31 which is fixed to the socket body, the fixing portion 31 having a recessed area 31a reducing the width of the fixing portion 31 and defining a post 32a at one end of the fixing portion, (b) a C-shaped cantilever portion 32 which is formed integral with the upper part of the fixing portion and has the opening faced toward the inside of the socket body, (c) an S-shaped resilient curved portion 33 which is formed integral with the upper part of the C-shaped part of the cantilever portion 32 in a circular-curved shape as if the C-shaped part of the cantilever portion 32 is substantially reversed and has a profile continuing to the cantilever portion in the S shape, (d) a contact portion 34 which is formed integral with the resilient curved portion and comes in contact with IC package leads, and (e) an engaging portion 35 engaged with the cover, which is formed integral with the resilient curved portion 33 and provided in an opposite direction to the contact portion in reference to the resilient curved portion 33.

In the IC socket having the contacts 3 which have the above-described feature, the coupling portion 36 where the resilient curved portion 33 is branched to the contact portion 34 and the engaging portion 35 (see FIG. 1) moves up under an operating condition from a normal position as shown in FIG. 4, to an open position as shown in FIG. 5. The amount of movement of the contact portion 34 of the contact 3 during operation in a direction away from the position of FIG. 4 to the position of FIG. 5 takes the contact portion to a position out of interference with the IC package, thus facilitating mounting or remounting of an IC package. The amount of movement is large and thus the internal stress placed on a contact is increased. The internal stress on the contact 3 during the operation condition and when closing on the IC leads, as shown in FIG. 6, is distributed to the C-shaped cantilever portion 32 and the resilient curved portion 33, and consequently, the spring characteristic of the contact can be maintained for a long period of time.

A depressing force can be applied before the IC package is mounted when the distance L1 (shown in FIG. 1) from the contact portion 34 to the fixing portion 31 is set to be smaller than the distance L2 (shown in FIG. 4) from the fixing portion 11 of the socket body 1 to the IC package mounting surface or portion 12. Therefore an engaging force necessary to ensure a reliability of engagement can be obtained even when the thickness of the IC package leads varies.

Figure 8:
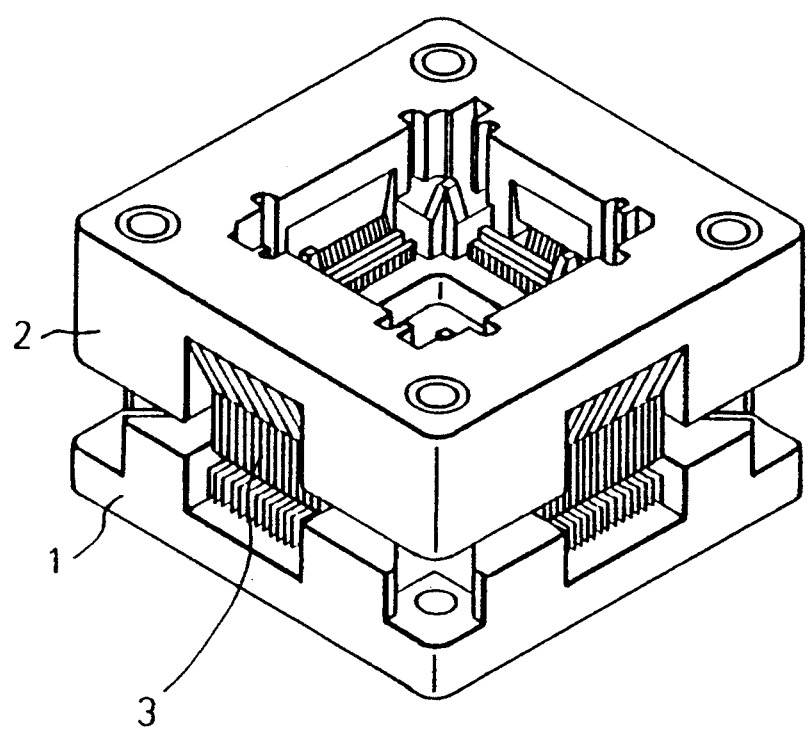
FIG. 8 is a perspective view showing the regular condition of the IC socket before the test, according to another embodiment of the present invention.
Figure 9:
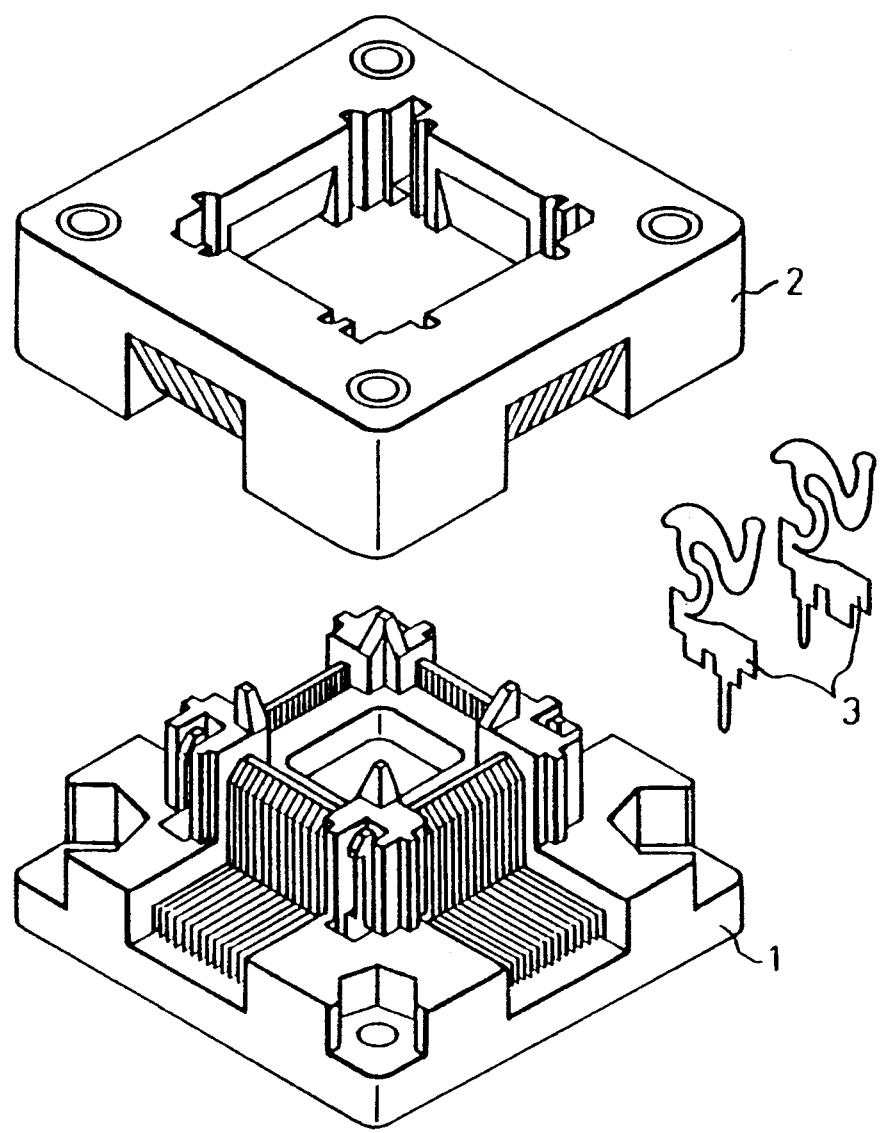
FIG. 9 is a disassembled perspective view showing the overall construction of the IC socket according to another embodiment of present invention.
Figure 10:
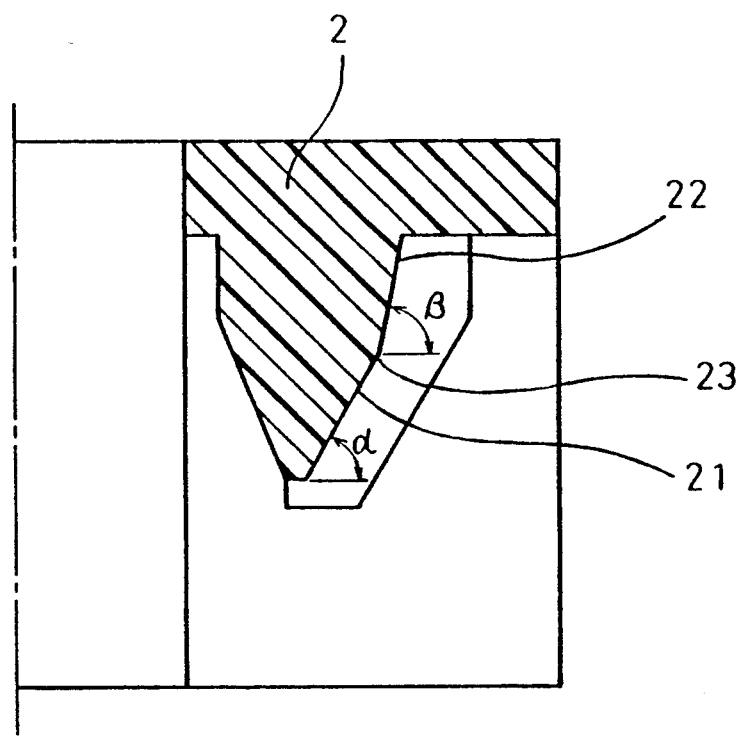
FIG. 10 is a cross-sectional view of the cover of the IC socket according to another embodiment of the present invention.

The following paragraphs describe the other embodiments of the present invention, referring to the accompanying drawings. FIG. 8 is a perspective view of another embodiment of the IC socket according to the present invention, and the IC socket, as shown in FIG. 9, comprises a socket body 1, a cover 2 and a plurality of contacts 3 and the engaging portion of the cover 2 for the contacts 3 is formed with two inclined surfaces 21 and 22 with an angle of $\alpha < \beta$ as shown in FIG. 10. The coupling portion 23 of these two inclined surfaces can be a small curved surface.

Figure 7:
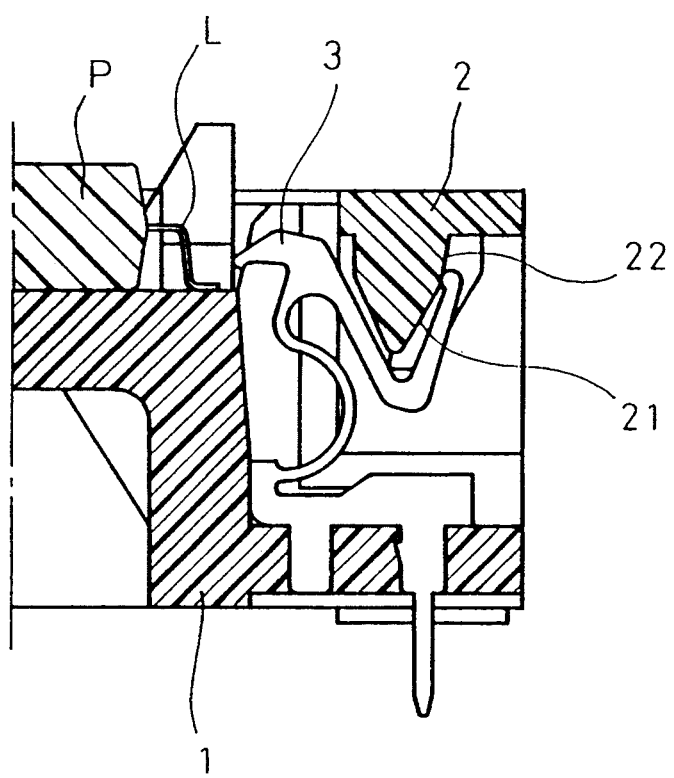
FIG. 7 is a cross-sectional view showing an operating condition of the IC socket according to another embodiment of the present invention.
Figure 11:
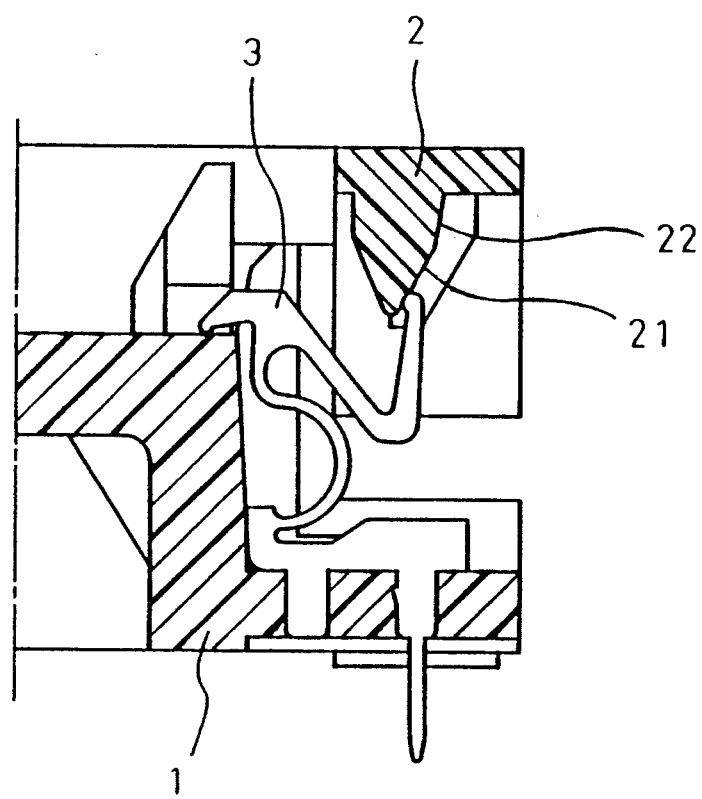
FIG. 11 is a cross sectional view showing the regular condition of the IC socket before the test, according to another embodiment of the present invention.
Figure 12A:
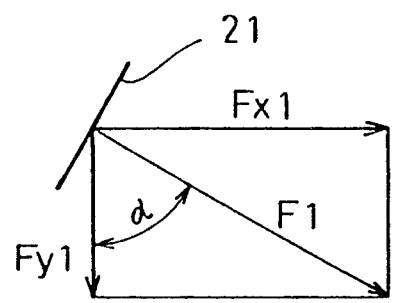
FIG. 12(a) is a vector diagram showing the repulsive force of the contact which is produced at the engaging portion of the cover in the IC socket along one cam surface and FIG. 12(b) illustrates the repulsive force of the contact which is produced at the engaging portion of the cover in the IC socket along a second cam surface according to another embodiment of the present invention.
Figure 12B:
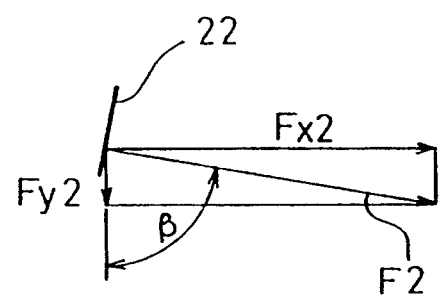

In case of the IC socket including the cover 2 which has the above-described features, a force Fy1 for pushing down the cover 2 as shown in FIG. 12(a) is required when the inclined surface 21 slides to engage with the contact 3 as shown in FIG. 11 and a force Fy2 for pushing down the cover 2 as shown in FIG. 12(b) is required when the inclined surface 22 slides to engage with the contact 3 as shown in FIG. 7. The repulsive force F1 of the contact 3 when the contact 3 engages with the inclined surface 21 is equal to the repulsive force F2 of the contact 3 when the contact 3 engages with the surface 22 (F1=F2), and therefore the pushing down force to the cover 2 if Fy1>Fy2 and the pushing down force changes from Fy1 to Fy2 at a specified position when the cover is pushed down.

Therefore, the IC socket according to the present invention allows for variation of the pushing down force to the cover 2 at the specified position before the lowest position when the cover 2 is operated, and to know in advance the lowest position in order to avoid adding of an unnecessary pushing force at the lowest position, thus reducing a possibility of damaging the IC socket and the board.

Figure 13:
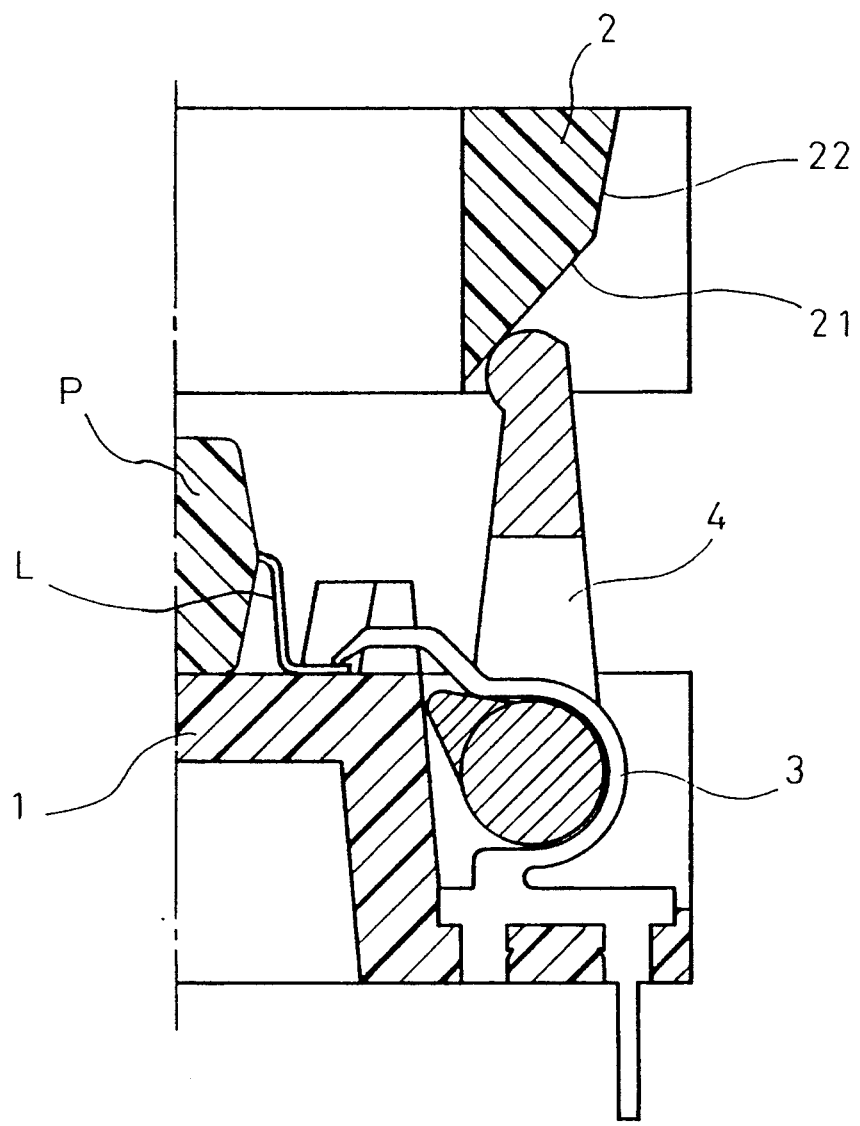
FIG. 13 is a cross sectional view showing the IC package mounted on the IC socket according to another embodiment of the present invention.
Figure 14:
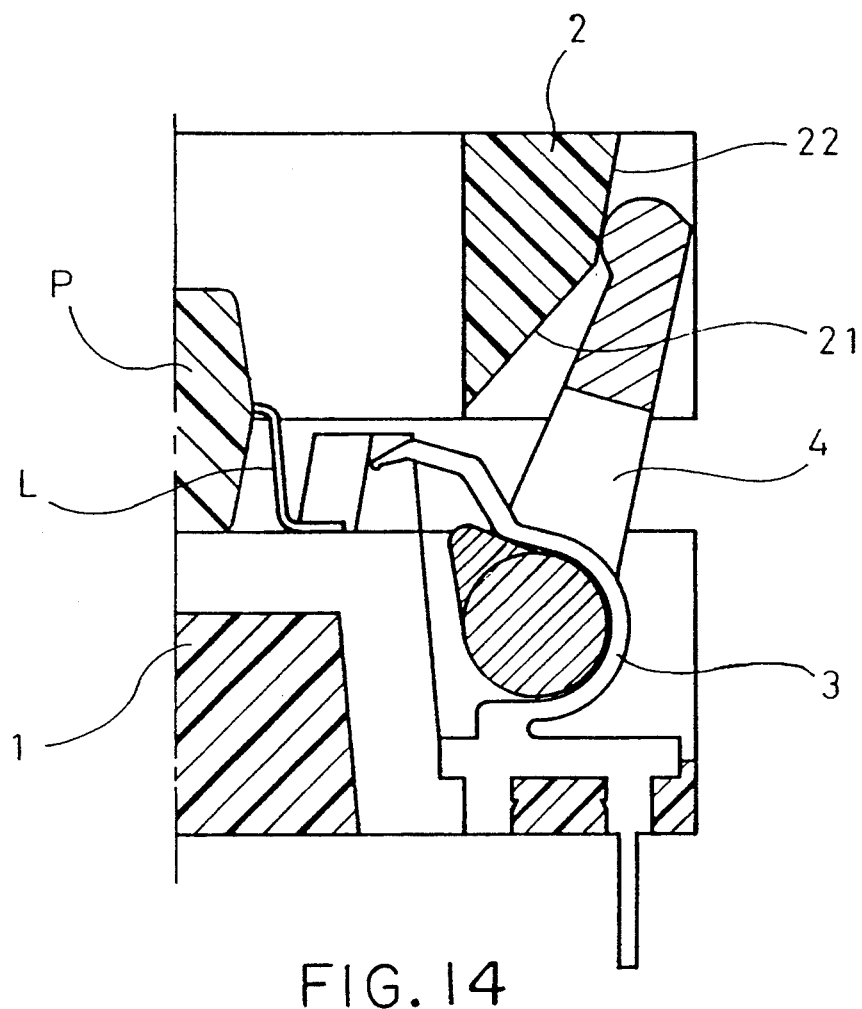
FIG. 14 is a cross sectional view showing an operating condition of the IC socket according to another embodiment of the present invention.
Figure 15:
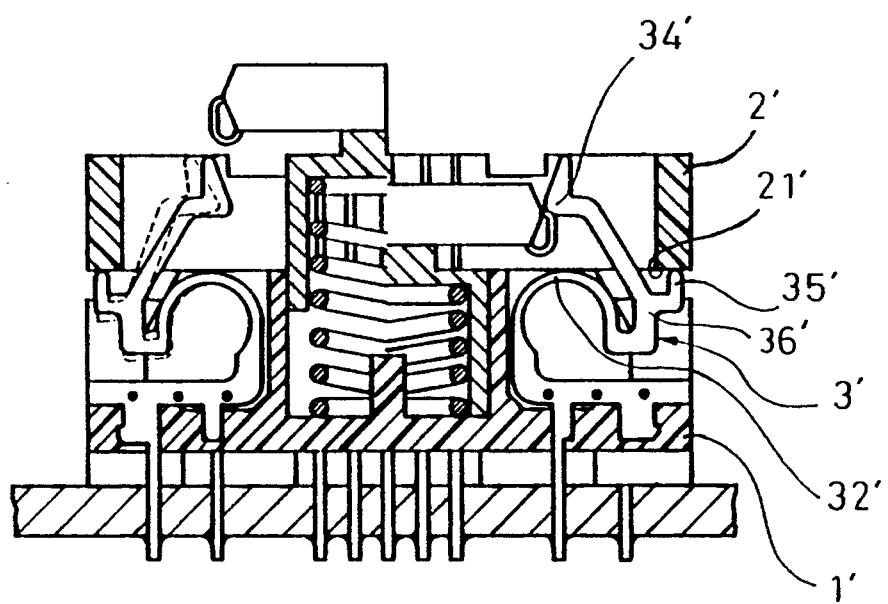
FIG. 15 is a cross sectional view of the conventional IC socket disclosed in the Unexamined Patent Publication 1987-1600676.
Figure 16:
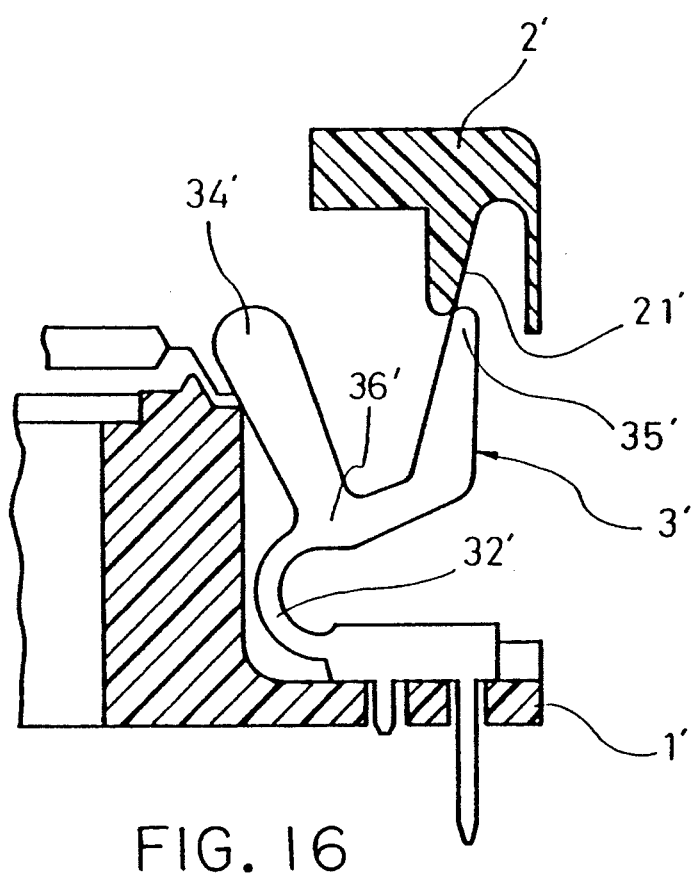
FIG. 16 is a cross-sectional view of the conventional IC socket disclosed in the Unexamined Patent Publication 1988-62175.
Figure 17:
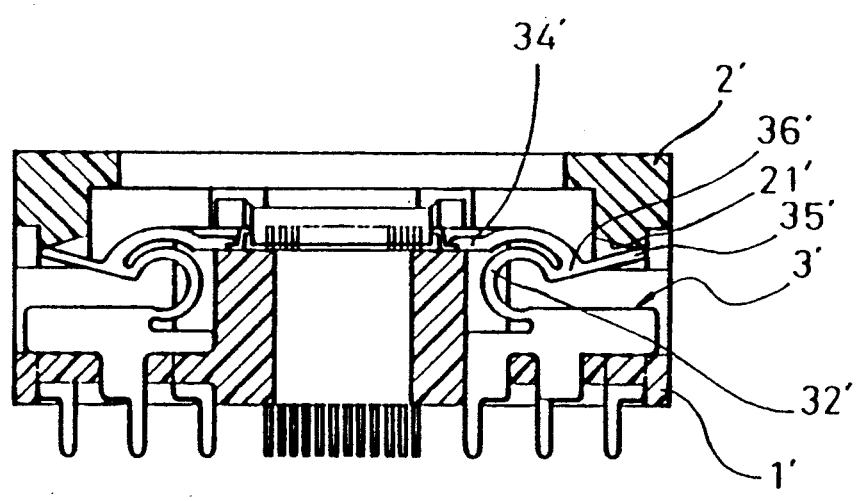
FIG. 17 is a cross-sectional view of the conventional IC socket disclosed in the Unexamined Patent Publication 1988-299257.
Figure 18:
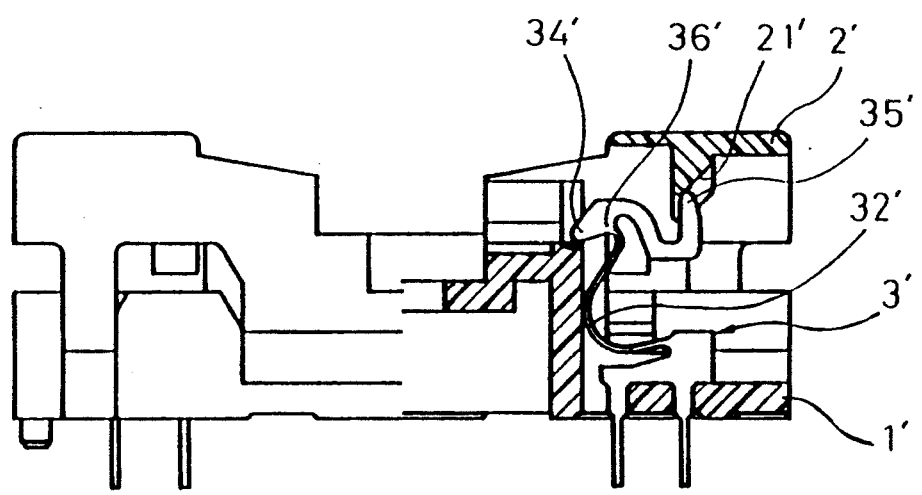
FIG. 18 is cross-sectional view of the conventional IC socket disclosed in the Unexamined Patent Publication 1990-94374.
Figure 19:
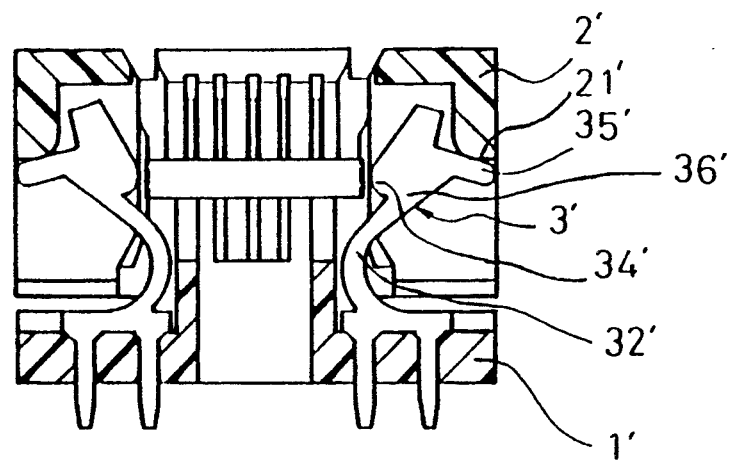
FIG. 19 is a cross-sectional view of the conventional IC socket disclosed in the U.S. Pat. No. 4,623,208.
Figure 20:
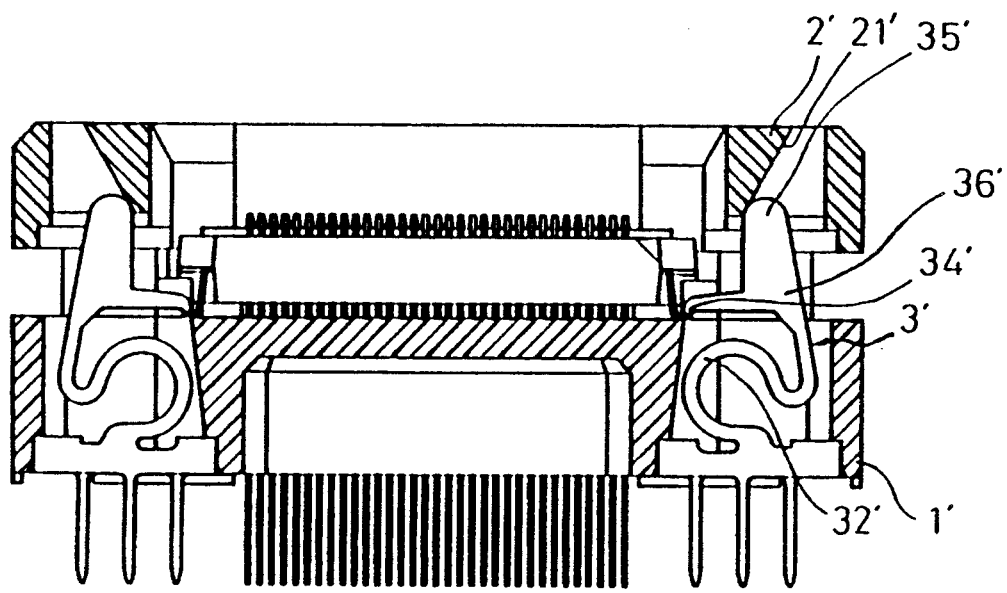
FIG. 20 is a cross-sectional view of the conventional IC socket disclosed in the U.S. Pat. No. 4,886,470.

In addition, FIG. 13 and 14 respectively show another embodiment of an IC socket according to the present invention. This IC socket comprises a socket body 1, a cover 2, a contact 3 and a cam lever 4. The cam lever 4 rotates when the cover 2 moves down and turns the contact 3 in a direction where the contact 3 is disengaged from the lead (L) of the IC package (P). Also in this case, the engaging portion of the cover 2, which engages with the cam lever 4, is formed with two inclined surfaces 21 and 22 having different angles as described above so that the pushing down force to the cover may be varied at the specified position before the lowest position when the cover 2 is operated.

As described above, the present invention has an effect that the amount of movement of the contact portion of the contact in a direction where the contact portion moves away from the IC package when it is operated is large enough to reduce the possibility of interference of the contact with the IC package lead and to facilitate remounting the IC package by comprising the contact with the fixing portion, the C-shaped cantilever portion, the resilient curved portion, the contact portion and the engaging portion as described above and, in addition, the internal stress of the contact when it is operated is distributed to the C-shaped cantilever portion and the resilient curved portion to make it possible to maintain the spring characteristic for a long period of time, thus ensuring the engagement reliability of the contact for a long period of time.

Also, since a depressing force can be applied before the IC package is mounted, the contacts are hardly affected by variations in the thickness of leads of IC package and are able to provide a stable engaging force.

In addition, the present invention has an effect that the lowest position in downward movement of the cover can be known in advance by forming, in an IC socket, the engaging portion of the cover, which slides to engage with the depressed portion of the contact, with two inclined surfaces having different angles of inclination and causing the pushing down force to the cover to be varied at the specified position before the lowest position when the cover is operated and therefore an unnecessary pushing force need not be added at the lowest position, thus reducing a possibility of damaging the IC socket and the board.

I claim:

1. An IC socket comprising a socket body which has a plurality of contacts positioned adjacent the edges of said body to be connected with leads of an IC package while being resiliently depressed, and a cover, which is mounted on and movable in relationship to said socket body, having inclined surfaces to engage and depress said contacts to displace them outwardly against their resilience when said cover is moved toward said body, wherein each said contact has (a) a fixing portion which is fixed to said socket body, said fixing portion having a recessed area reducing the width of the fixing portion and defining a post at one end of the fixing portion,
(b) a C-shaped portion which is formed continuously integral with said fixing portion and is cantilever mounted at one end to said post to extend therefrom into said recessed area and positioned to be open-faced to the inside of said socket body,
(c) a resilient curved portion which is formed integral with the other end of said C-shaped cantilever portion in a circular curved shape as if the C-shaped part of said cantilever portion is substantially reversed and is totally S-shaped in conjunction with said cantilever portion,
(d) a contact portion which is formed integral with said resilient curved portion and comes in contact with a lead of said IC package, and
(e) an engaging portion engaged with said cover, which is formed integral with said resilient curved portion and provided in an opposite direction to said contact portion in reference to said resilient curved portion.

2. An IC socket in accordance with claim 1, wherein said engaging portion engages said inclined surface of said cover, wherein said inclined surface is formed by two inclined surfaces with different degrees of inclinations.

* * * * *